(12) United States Patent
Tosi et al.

(10) Patent No.: US 7,927,898 B2
(45) Date of Patent: Apr. 19, 2011

(54) APPARATUS AND METHODS FOR PACKAGING ELECTRONIC DEVICES FOR OPTICAL TESTING

(75) Inventors: Alberto Tosi, Invorio (IT); Franco Stellari, Ho Ho Kus, NJ (US); Peilin Song, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/534,556

(22) Filed: Aug. 3, 2009

(65) Prior Publication Data

US 2009/0284736 A1 Nov. 19, 2009

Related U.S. Application Data

(62) Division of application No. 11/085,734, filed on Mar. 21, 2005, now Pat. No. 7,635,904.

(51) Int. Cl.
*H01L 21/00* (2006.01)
(52) U.S. Cl. ............................ 438/29; 257/431; 257/466
(58) Field of Classification Search .................. 438/29; 257/431–466
See application file for complete search history.

(56) References Cited

U.S. PATENT DOCUMENTS

2004/0129991 A1* 7/2004 Lai et al. ........................ 257/433
* cited by examiner

*Primary Examiner* — Leonardo Andújar
(74) *Attorney, Agent, or Firm* — F. Chau & Associates, LLC; Anne V. Dougherty, Esq.

(57) ABSTRACT

Apparatus and methods are provided for packaging IC (integrated circuit) chips to enable both optical access to the back side of an IC chip and electrical access to the front side of the IC chip.

9 Claims, 4 Drawing Sheets

APPARATUS AND METHODS FOR PACKAGING ELECTRONIC DEVICES FOR OPTICAL TESTING

CROSS REFERENCE TO RELATED APPLICATIONS

This application is a Divisional of U.S. application Ser. No. 11/085,734 filed on Mar. 21, 2005, now U.S. Pat. No. 7,635,904, which is fully incorporated herein by reference.

TECHNICAL FIELD OF THE INVENTION

The present invention relates generally to apparatus and methods for packaging semiconductor IC (Integrated Circuit) chips. More specifically, the present invention relates to apparatus and methods for constructing semiconductor IC chip packages that enable optical testing of semiconductor IC chips.

BACKGROUND

In general, various optical testing systems and methods have been developed for debugging high-performance IC chips. For example, optical testing techniques include Picosecond Imaging for Circuit Analysis (PICA) EMission MIcroscopy (EMMI), Laser Voltage Probe (LVP), Thermal Laser Stimulation (TLS) and Photoelectric Laser Stimulation (PLS). Through optical testing, these optical systems provide non-invasive methods for probing many different points of an IC chip while debugging a problem without necessarily knowing a priori the location of a fault or chip defect. Optical testing allows testing of internal signals of the IC chip provided that the device (transistor) level of the IC chip is optically accessible.

Typically, optical access to the transistors and other components of an IC chip is possible (or practically feasible) only from the back (non-active) side of the IC chip. Indeed, optical testing from the front (active) side surface of the IC chip is significantly impeded by the dense BEOL (back end of line) metallization structures. Most available IC chip packages, however, are designed exclusively for electrical testing and do not take into account the requirements of optical testing from the backside.

One type of IC chip design that can be readily implemented for optical testing from the backside using conventional packaging techniques includes IC chips designed for flip-chip packaging. For example, FIG. 1A schematically illustrates a conventional apparatus (100) for flip-chip packaging. In particular, FIG. 1A depicts a flip-chip package (100) comprising a package cover (encapsulation) (110) and a first level package carrier (115) (e.g., ceramic or plastic substrate) with an array of large solder balls (130) (e.g., BGA, ball grid array) that are used for bonding the substrate (115) to a card or printed circuit board (not shown). An IC chip (120) having a front side (145) and a back side (146) is flip-chip bonded to bond sites on the carrier (115) using an array of fine pitch solder balls (140) (e.g., C4 (Controlled Collapsed Chip Connect)), which provide electrical connections to integrated circuit interconnects, transistors, components, for example, formed on the frontside (145) of the IC chip. The carrier substrate (115) provides a space transformation between electrical connections from the chip to the printed circuit board.

With such conventional flip-chip packaging design, the IC chip (120) can be optically probed from the backside (146) without interference from the metal wiring, e.g., BEOL, carrier wiring, and solder ball connections (140). Such optical probing can be performed directly on the flip-chip packaged chip (120), if desired, by removing the encapsulation or cover (110).

With other conventional packaging designs, such as TCA (temporary chip attached) packages, IC chips designed for flip-chip BGA (ball grid array) packages can be mounted to TCA packages to allow optical testing from the backside of the IC chip. TCA packages can be used for testing a chip during the chip prototyping phase.

On the other hand, IC chips that are designed for wire-bond type packaging do not allow for optical testing from the backside. FIG. 1B schematically illustrates a conventional apparatus (150) for wire-bond chip packaging. In particular, a wire-bond chip package (150) comprises a package cover (encapsulation) (160) and a package carrier (163) (e.g., ceramic or plastic substrate) with an array of large solder balls (164) that are used for soldering the substrate (163) to a card or printed circuit board (not shown). An IC chip (165) having a front side (166) and a back side (167) is backside mounted to the carrier substrate (163) using solder or other adhesives, for example. A plurality of wire bonds (180) are formed to make electrical connections between bond pads, which are formed around the perimeter of the front side (166) surface of the chip (165), to bond pads (not shown) that are formed on the carrier substrate (163).

With this type of packaging, even with the cover (160) removed, as noted above, optical access to the integrated circuit components in the front side (166) of the chip (165) is difficult and impractical due to the BEOL metallization. Thus, IC chips designed for wire-bond type packaging are generally not suitable for optical testing. In fact, optical testing cannot be performed (or is not practically feasible) for IC chips (such as wire-bond type chips) that cannot, by design, be mounted for testing using a TCA package or which cannot be packaged (e.g. flip-chip packages) in a manner that enables free optical access to the backside substrate for optical testing.

Moreover, certain chips that can not be mounted for testing in TCA packages require custom package designs. For example, when an IC chip is taken off the production line before the final metals are formed, even if the final product will use a flip-chip package, the chip cannot be mounted in a TCA package. Moreover, optical testing is not feasible when the cost for a TCA package (which can be thousands of dollars) is too high for a given testing budget. Furthermore, when an IC chip is to be used after optical testing, most packages are designed such that the IC chip will be damaged or destroyed if the IC chip is removed from the package.

SUMMARY OF THE INVENTION

In general, exemplary embodiments of the invention include apparatus and methods for packaging semiconductor IC (integrated circuit) chips. More specifically, exemplary embodiments of the invention include apparatus and methods for packaging IC chips to enable both optical access to the back side of the IC chip and electrical access to the front side of the IC chip.

In one exemplary embodiment of the invention, an apparatus for packaging an IC chip comprises a mounting plate having a first surface and a second surface. The mounting plate is used for mounting an IC chip having a front (active) surface and a back (non-active) surface is mounted to the mounting plate, wherein the back surface of the chip is mounted to the first surface of the mounting plate. The portion of the mounting plate adjacent the back surface of the IC chip is transparent to one or more wavelengths of light to allow photons to pass through the mounting plate between the first and second surfaces. For purposes of optical testing, the mounting plate is transparent to photons emitted from the IC chip and/or transparent to photons emitted by a laser that is used to irradiate the IC chip.

In another exemplary embodiment of the invention, the package apparatus comprises a package body, wherein the mounting plate is attached to the package body. The package body includes wires and connectors to provide an electrical interface to the IC chip. The package body may be formed using a printed circuit board.

In another exemplary embodiment of the invention, the package body includes an aperture region formed between a first and second surface of the package body. The mounting plate is attached to the first surface of the package body such that the IC chip is aligned and inserted into the aperture. The package structure further includes wire bond connections between bond pads on the front surface of the IC chip and wires or bond pads formed on the package body.

In yet another exemplary embodiment of the invention, one or more off-chip electrical components are mounted on the first surface, second surface or first and second surfaces of the package body.

In another embodiment of the invention, an index matching material can be disposed between the mounting plate and the back surface of the IC chip. The index matching material may be bonding material that is used to bond the back surface of the IC chip to the mounting plate. In another exemplary embodiment, the mounting plate may be formed of a material that is doped with another material to match an index of refraction of the mounting plate to an index of refraction of substrate material of the IC chip. The mounting plate can be formed of silicon, glass, quartz, diamond, or other suitable material(s).

These and other exemplary embodiments, aspects, features and advantages of the present invention will be described or become apparent from the following detailed description of exemplary embodiments, which is to be read in connection with the accompanying drawings.

BRIEF DESCRIPTION OF THE DRAWINGS

FIGS. 4A and 4B are diagrams that schematically depict the photon collection efficiency for an exemplary packaging apparatus, wherein FIG. 4A depicts photon collection efficiency with an air gap present between a mounting plate and the back side surface of an IC chip, and wherein FIG. 4B depicts photon collection efficiency when a layer of matching material is disposed between the mounting plate and the back side surface of the IC chip.

DETAILED DESCRIPTION OF EXEMPLARY EMBODIMENTS

Figure 1A:
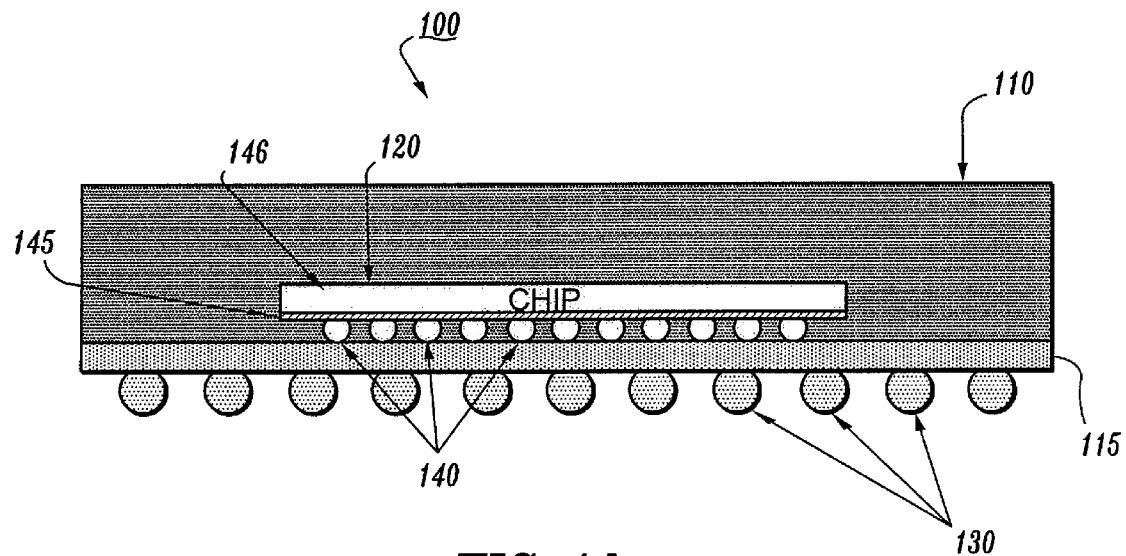
FIG. 1A schematically illustrates a conventional apparatus for flip-chip packaging.
Figure 1B:
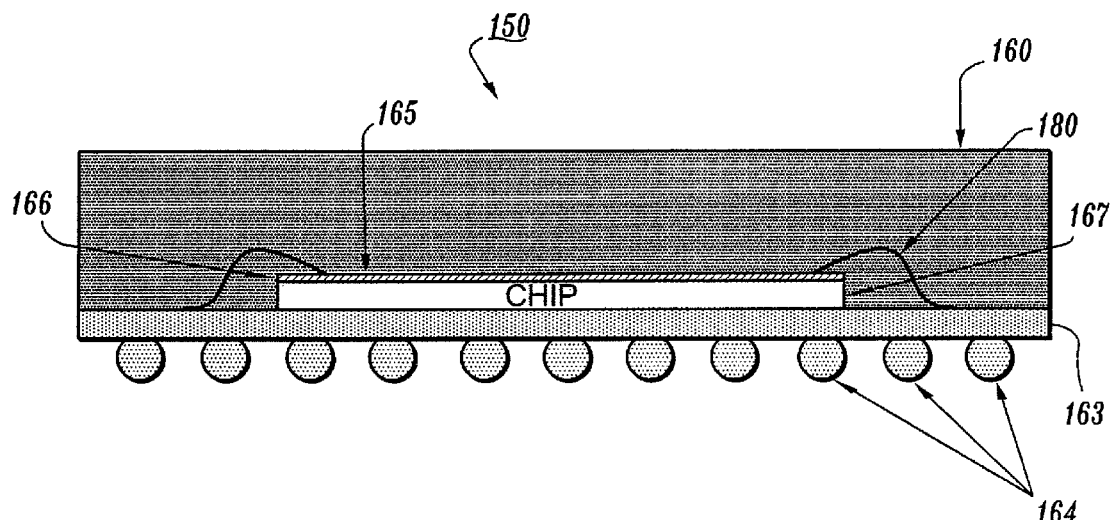
FIG. 1B schematically illustrates a conventional apparatus for wire-bond chip packaging.
Figure 2A:
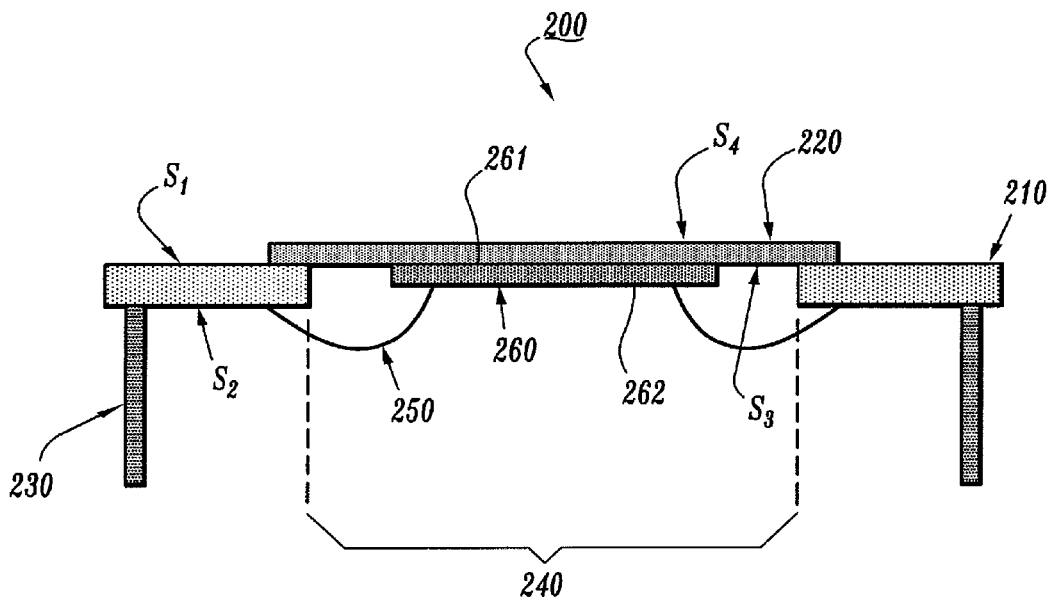
FIGS. 2A and 2B schematically illustrate an apparatus for packaging a semiconductor integrated circuit chip according to an exemplary embodiment of the invention.
Figure 2B:
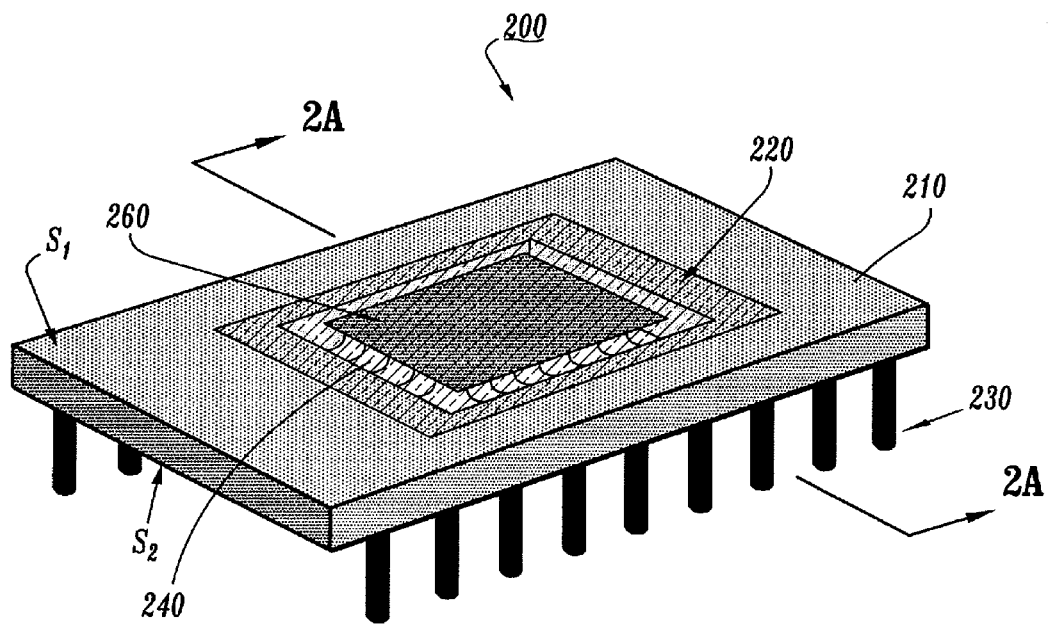

FIGS. 2A and 2B schematically illustrate an apparatus for packaging a semiconductor IC chip, according to an exemplary embodiment of the invention. More specifically, FIG. 2B is a schematic perspective view of a package apparatus (200) according to an exemplary embodiment of the invention and FIG. 2A is a cross-sectional side view of the apparatus (200) taken along line 2A-2A in FIG. 2B. The exemplary apparatus (200) provides both optical access to a back side (261) of a semiconductor IC chip (260) and electrical access to a front side (262) of the IC chip (260), to thereby enable optical testing of the IC chip (260). It is to be appreciated that the IC chip (260) may be any type of chip, such as a flip-chip type chip or wire-bond type chips, or an IC chip that is pulled off a production line before completion, e.g., before BEOL metallization, for purposes of testing.

The package apparatus (200) comprises a package body (210) having a first surface (S1) and second surface (S2), a plurality of pin connectors (230) (which may be ball or other types of connectors, depending on the application), and an aperture (240) formed through the first and second surfaces (S1), (S2). The package body (210) may be formed of any suitable structure. For instance, the package body (210) may be formed using a single-sided PCB (printed circuit board) comprising a dielectric substrate material with a thin layer of metal on one surface (e.g., S2) thereof. In this regard, the metal layer on surface (S2) can be patterned to form wires and wire bond pads (not shown) on the surface (S2) of the package body (210) which are electrically connected to the pin connectors (230) to provide an electrical interface to the IC chip (260). In other exemplary embodiments, the package body (210) can be formed using ceramic or plastic materials using techniques known to those of ordinary skill in the art.

The apparatus (200) further comprises a mounting plate (220) (or mounting substrate) having opposite surfaces (S3) and (S4). The IC chip (260) is mounted to a surface (S3) of the mounting plate (220) (i.e., the back side (261) surface of the chip (260) is mounted to the surface (S3) of the mounting plate (220). The mounting plate (220) is attached to the package body (210) such that the IC chip (260) is aligned with, and inserted into, the aperture (240) and such that a peripheral region of surface (S3) of the mounting plate (220) is in contact with a peripheral region of surface (S1) of the package body (210) surrounding the aperture (240). Wirebonds (250) are formed from bond pads (or bond sites) on the front side (262) surface of the IC chip (260) to appropriate bond pads or wires on the bottom surface (S2) of the package body (210).

Figure 3A:
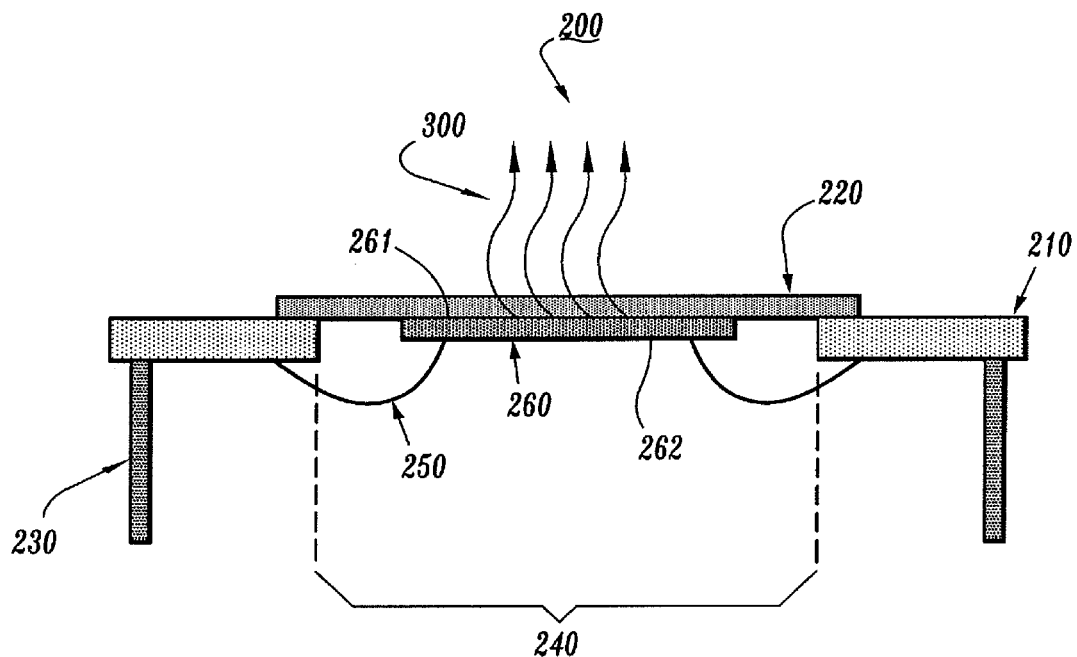
FIGS. 3A and 3B schematically depict methods for optically testing an IC chip that is packaged using packaging apparatus and methods according to exemplary embodiments of the invention.
Figure 3B:
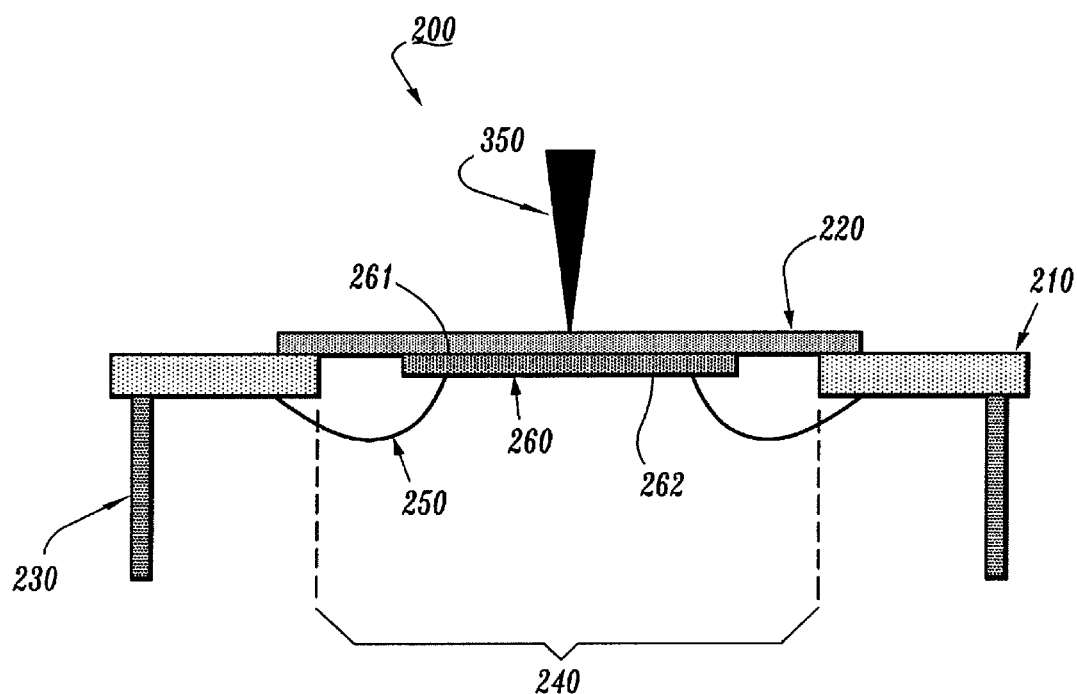

The exemplary package apparatus (200) allows optical access to the transistor/component level of the chip from the back side (261) of the IC chip (260) for purposes of optical testing. For instance, as depicted in FIG. 3A, optical testing can be performed by collecting and analyzing photons (300) that are emitted from the back side (261) of the chip (260) which pass through the mounting plate (220). In another exemplary embodiment as depicted in FIG. 3B, optical testing of the chip (260) can be performed by using a laser beam (350) to irradiate certain points of interest within the chip (260) through the mounting plate (220) and back side of the chip (260), and then measuring electrical signals obtained via the front side electrical access of the chip (260) to determine the electrical response of circuit components. In yet another exemplary embodiment, chip testing can be performed by focusing a laser beam onto the IC chip and then collecting and analyzing a reflected beam for optically testing the chip.

The mounting plate (220) is formed using any suitable material(s) with certain properties and an appropriate thickness such that the mounting plate (220) is "transparent" to light at one or more wavelengths of interest for the optical testing. In other words, for a given material (or materials) forming the mounting plate with a given thickness, the mounting plate (220) should be "transparent", i.e., permeable to electromagnetic energy of one or more wavelengths of interest suitable for optical testing, such that photons can pass through the mounting plate (220) between surfaces S1 and S2. For example, in one exemplary embodiment, the mounting plate (220) is designed to be transparent at wavelengths in the range of about 0.8 µm to about 1.7 µm to allow measuring of hot-carrier luminescence. The level or degree of transparency required or desired will vary depending on the application.

The mounting plate (220) can be made of any suitable material(s) such as glass, diamond, quartz, organic materials, plastics, etc., which renders the mounting plate (220) (with a certain thickness) transparent at the wavelength(s) of interest. Although transparency of the mounting plate (220) is one primary consideration, other factors that may be considered in designing the mounting plate (220) include structural integrity and heat dissipation. Indeed, in addition to transparency, the material and thickness of the mounting plate (220) should be selected to provide suitable structural integrity and rigidity to support the chip (260) during the testing procedures and to prevent breakage when the chip (260) is attached to the mounting plate (220). Indeed, depending on the properties of the material(s) used, although the mounting plate (220) may be sufficiently transparent at a wavelength of interest for a given thickness, such thickness may be too thin to provide the structural integrity required for the given application.

In other exemplary embodiments, in addition to transparency and structural integrity, the mounting plate (220) could be formed with one or more materials that provide sufficient thermal conductivity to conduct heat away from the IC chip (260). In this regard, the mounting plate (220) would act as a heat spreader to conduct heat from the chip (260), wherein heat is removed from the mounting plate (220) by methods such as forced air cooling or liquid cooling. For example, for a given application, a transparent silicon substrate of an appropriate thickness can be used as the mounting plate (220), because of the high heat conduction and dissipation properties of silicon. Based on the teachings herein, one of ordinary skill in the art would be able to readily determine an appropriate compromise between rigidity, heat conduction and optical transmission when designing a mounting plate (220) of a packaging structure for a given application.

Exemplary methods for fabricating a package structure such as depicted in FIGS. 2A and 2B will now be discussed. Some initial steps in constructing a package structure include fabricating the mounting plate (220) and mounting the back side (261) surface of the IC chip (260) to the mounting plate (220). To enable sufficient optical access to the back side (261) of the IC chip (260), the substrate of the IC chip (260) can be thinned to enable photons emitted from the chip devices (e.g., transistors) to pass through the back side substrate and be emitted from the back side (261) surface of the IC chip (260). In this regard, in one exemplary embodiment of the invention, the IC chip (260) may be prepared for optical testing by subjecting the IC chip (260) to lapping, grinding, and/or polishing to thin down the chip substrate to a thickness of about 100 µm or less.

As noted above, the mounting plate (220) will be designed with one or more materials and thickness, to provide a sufficient level of transparency at the wavelength(s) of interest, while providing sufficient strength and rigidity to mitigate the risk of fracturing the mounting plate (220) during processing, bonding or assembly. In addition, as noted above, the mounting plate (220) may be designed to provide an effective means for cooling the IC chip (260) mounted thereto during optical testing of the chip (260).

Various methods according to exemplary embodiments of the invention can be implemented for mounting the back surface (261) of the IC chip (260) to the surface of the mounting plate (220). For instance, in one exemplary embodiment, the IC chip (260) may be mounted to the mounting plate (220) by placing the back side (261) surface of the IC chip (260) directly on a surface of the mounting plate (220), and then placing glue droplets (or other bonding/adhesive material) on the corners of the chip (260) or along the sides of the chip (260) to bond the chip (260) to the surface of the plate (220). In this embodiment, the glue should be carefully applied to avoid glue from flowing on the front side (262) surface of the chip (260) and making undesirable electrical connections between bonding pads on the front side (262) surface and/or limiting the optical access to the IC chip (260).

Further, is preferable to prevent glue material from flowing in the interface between the back side (261) surface of the IC chip (260) and the surface of the mounting plate (220), to thereby avoid non-planarity and formation of air gaps between the back side (261) surface of the chip (260) and the surface of the mounting plate (220). Indeed, as discussed below with reference to FIG. 4A, the existence of an air gap between the back side (261) surface of the chip (260) and the surface of the mounting plate (220) can cause a decrease in the transmittance of light from the chip (260) through the mounting plate (220) towards collection lenses and, thus, reduce the detection efficiency for optical testing.

In other exemplary embodiments of the invention, the chip (260) may be bonded to the mounting plate (220) using a layer of bonding material, such as specific glue, which acts as a matching index material to improve the collection efficiency of the photons emitted from the back side (261) of the chip. Indeed, as discussed below with reference to FIG. 4B, the use of a matching index material having an index of refraction, $n_M$, between the index of refraction, $n_{si}$, of the substrate material forming of the chip (260) and the index of refraction, $n_g$, of the material forming the mounting plate (220), will raise the transmittance of light through the mounting plate (220) toward collection lenses during optical testing.

In other exemplary embodiments of the invention, the IC chip (260) can be mounted using reusable mechanical means such as clips or clamps, for example, to provide temporary mounting mechanisms that enable the IC chip (260) to be readily removed from the mounting plate (220). This allows the IC chip (260) to be reused, or repackaged or sold to customers.

Thereafter, the mounting plate (220) with the IC chip (260) attached thereto is mounted to the package body (210). In particular, in one exemplary embodiment as noted above, the package body (210) comprises an aperture (240). Bonding material such as glue or other types of adhesive can be placed on the surface (S1) of the package body (210) around the periphery of the aperture (240). The mounting plate (220) is then maneuvered to align and insert the IC chip (260) into the aperture (240) while the peripheral region of the surface (S3) of the mounting plate (220) makes contact with the bonding material disposed on the package body (210) to thereby rigidly fix the mounting plate (220) to the package body (210). In other exemplary embodiments of the invention, the package apparatus (200) can be constructed by first attaching the mounting plate (220) to the package body (210), and then mounting the IC chip (260) to the mounting plate (220).

With the IC chip (260) mounted on the mounting plate (220), wire bonds can be formed between bond pads on the front side (262) surface of the chip (260) and bond pads or wires formed on the bottom surface (S2) of the package body (210). It is preferable to minimize the length of the wirebonds. Therefore, the size of the aperture (240) should be formed as small as possible based on the dimensions of the IC chip (260). Moreover, the bonding wires should not make contact with the package body (210) and thus, the package body (210) should be formed as thin as possible around the aperture (240). It is further desirable for the starting and finishing points of the wire bonding to be close together in terms of distance and altitude. Thus, in other exemplary embodiments of the invention, the package structure (200) can be designed such that the front side (262) surface of the chip (260) and bond pads formed on the package body (210) are substantially coplanar (on the same level).

As noted above, the package body (210) comprises wiring that provides electrical connections from the pin connectors (230) to bond pads or bond wire sites having bond wires (250) that connect to bond pads on the front side (262) surface of the IC chip (260). The arrangement/layout of the pin connectors (230) will vary depending on the application, test procedure, test board module, and/or chip being tested. For example, the pitch between the pins (230) and spacing between rows of pins (230) will be designed in accordance with the design of the socket module of the testing board of the optical testing tool (e.g., PICA tool) used for optical testing. The package apparatus (200) is mounted to the testing board by inserting the pin connectors (230) into the appropriate slots in the socket module, as is understood by those of ordinary skill in the art. In this regard, it is to be appreciated that a package apparatus according to an exemplary embodiment of the invention can be readily designed to meet the requirements of the electronic testing apparatus and testing board.

In other exemplary embodiments of the invention, electronic devices such as capacitors, resistors, driver circuits, and other electronic devices or circuits may be electrically mounted on the package body (210). These components may provide the necessary off-chip circuits for testing/operating the IC chip (260), provide the necessary impedance matching networks, or provide other functions necessary or desired for testing the IC chip (260).

It is to be appreciated that the fabrication methods described above are merely exemplary and that one of ordinary skill in the art can readily envision other methods for constructing package structures according to the invention. For instance, in other exemplary embodiments of the invention, a chip packaging manufacture can construct various standard or custom packaging structures (which are the same or similar to the packaging structure of FIGS. 2A and 2B) for commercial sale to various customers (e.g., chip manufactures). In such instance, the user (chip manufacture) would simply mount an IC chip to be tested to a standard or custom designed package apparatus and make the necessary wire bond connections from the chip to the package structure.

More specifically, a package manufacture can construct various types of standardized package structures that are compatible with standard chip sizes and optical testing tools, for example, which can be purchased by customers such as chip manufactures. When testing a chip, a standard package structure can be modified on site (e.g., adding off-chip components, rerouting metal wiring, etc.) to meet specific testing requirements or procedures. Alternatively, a package manufacture can construct custom package structures based on customer specifications. In all such instances, the customer could purchase a given package structure and then mount an IC chip to be tested to the mounting plate portion of the package structure using methods described above.

As noted above, the exemplary package apparatus (200) allows optical access to the back side (261) of the IC chip (260) for purposes of optical testing. As depicted in FIG. 3A, optical testing can be performed by collecting and analyzing photons (300) that are emitted from the back side (261) of the chip (260) which pass through the mounting plate (220). Conventional optical testing tools and procedures known to those of ordinary skill in the art can be used for optically testing the IC chip (260). For instance, electrical signals from the testing board of the optical testing tool (e.g., PICA tool) can be input to the chip (260) via the electrical interface (wiring, connectors, etc.) of the package body (210), and an objective lens can be positioned at certain points over the IC chip (260) to collect photons (300) emitted from the back side (261) of the chip (260).

In other exemplary embodiments of the invention such as depicted in FIG. 3B, optical testing of the chip can be performed using a laser beam (350) to irradiate certain points of interest within the chip (260) through the mounting plate (220) and through the back side of the chip (260), and then determine the electrical response of circuit components by measuring internal electrical signals of the chip (260) via the electrical interface provided by the package body (210). The response to the incident photons are measured by the testing device to which the chip (260) is connected. The incident photons may be generated either synchronously or asynchronously with the chip operation and testing procedure.

During optical testing, cooling mechanisms such as diamond windows or spray (air, nitrogen or specific cooling sprays) or other suitable cooling techniques may be implemented for cooling the IC chip (260). These cooling materials can be applied to the surface of the mounting plate opposite the surface on which the chip (260) is mounted.

It is to be appreciated that packaging structures according to exemplary embodiments of the invention may be implemented with Solid Immersion Lens (SIL) systems, which can be used for increasing the numeric aperture of the optical system that collects the photons emitted from the back side (261) of the chip (260). SIL lenses can be applied directly to the transparent mounting plates on the surface opposite the surface on which the IC chip is mounted. Instead of SIL lenses, liquid immersion lenses may be employed since the liquid only contacts the surface of the mounting plate opposite the surface on which the chip is mounted.

Figure 4A:
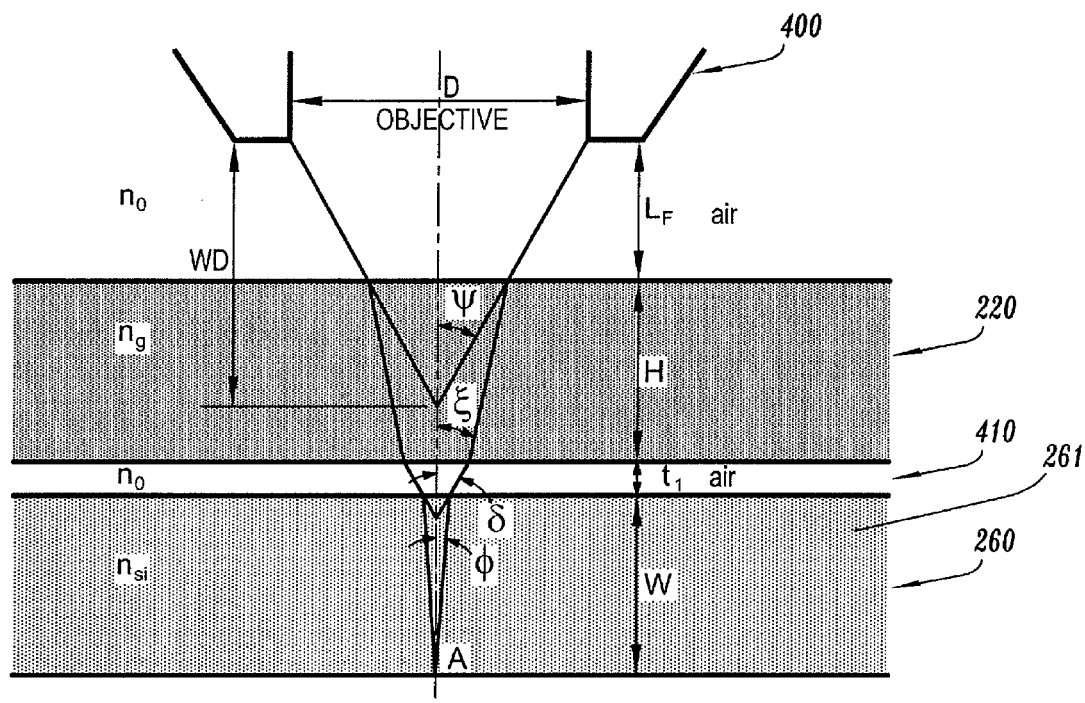
Figure 4B:
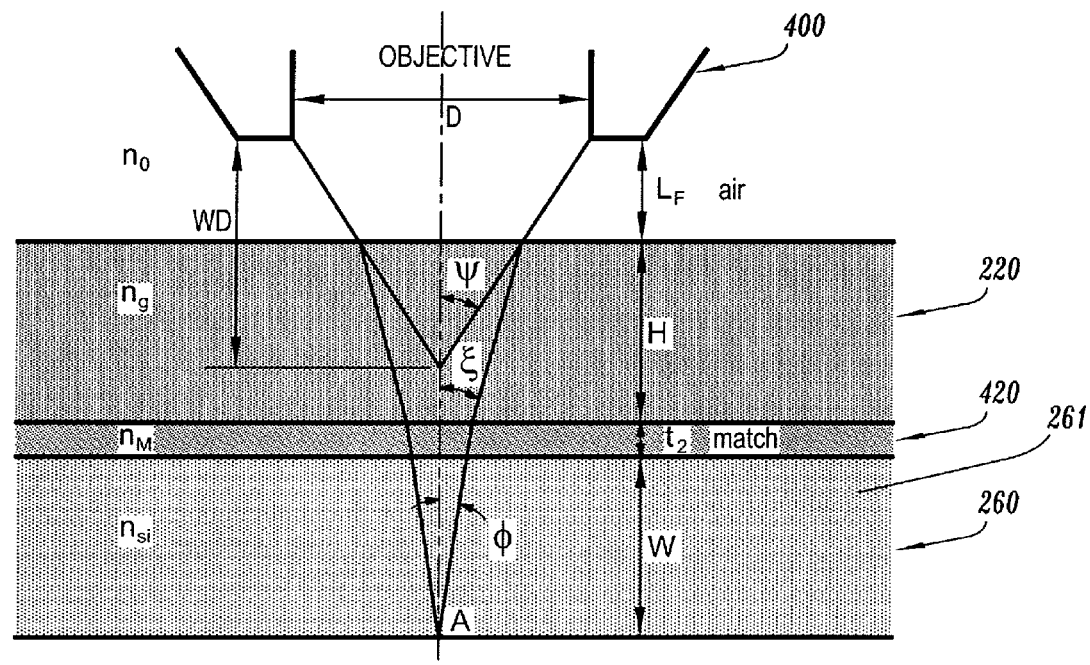

FIGS. 4A and 4B are diagrams that schematically depict the photon collection efficiency for an exemplary packaging apparatus. In particular, FIG. 4A depicts photon collection efficiency with respect to an objective lens (400) with an air gap (410) present between the mounting plate (220) and the back side (261) surface of the IC chip (260). FIG. 4B depicts photon detection efficiency of the objective lens (400) when a layer (420) of matching material is disposed between the mounting plate (220) and the back side (261) surface of the IC chip (260).

In the exemplary depictions, the reference label A denotes a point from which photons are emitted from within the chip (260), D denotes the diameter of the objective lens (400), WD denotes the working distance (or focal length) of the objective (400) in air, LF denotes a distance between the objective (400) and the surface of the mounting plate (220), H denotes the thickness of the mounting plate (220), $t_1$ denotes the thickness of the air gap (410), $t_2$ denotes the thickness of the layer (420) of matching material, and W denotes the distance from the photon emission point A to the back side (261) surface of the chip (260).

It is known that a light ray will bend toward a normal to a boundary surface when the ray propagates into a region with a higher index of refraction and that a ray will bend away from the normal to a boundary surface when the ray propagates into a region with a lower index of refraction. In the exemplary diagrams, it is assumed that the refractive index, $n_g$, of the mounting plate (220) is smaller than the refractive index, $n_{si}$, of the chip substrate (260) and that the refractive index, $n_M$, of the matching material 420) is between $n_g$ and $n_{si}$. Assume further that the thickness $t_1$ of the air space (410) is the same thickness $t_2$ of the layer (420) of matching material.

From FIGS. 4A and 4B, one can glean that the angles $\Psi$, $\xi$, $\phi$ are wider when a matching index material (420) is used as depicted in FIG. 4B, as opposed to when an air interface (410) exists as depicted in FIG. 4A. Moreover, using the basic formulas of optics, the distance LF between the objective lens (400) and the surface of the mounting plate (220) is lower and the collecting angle can reach higher values, thus allowing a more efficient collection of the light from the emission point A. Moreover, the transmission of light from A to the objective (400) is higher due to the matching of refractive indexes. The transmitting coefficient T can be written as $$T = \frac{4 \cdot n_1 \cdot n_2}{(n_1 + n_2)^2}$$

for normal incidence. The maximum of T can be achieved only with an appropriate matching index material (420).

It is to be appreciated that in other exemplary embodiments of the invention, instead of, or in addition to, using the layer of matching material (420), the mounting plate (220) can be doped with some suitable material that enables increased matching for increasing detection efficiency, as is understood by those of ordinary skill in the art. For example, as is known in the art, certain impurities (e.g., metal) can be added to glass material (silica oxide) to change the optical properties.

Although exemplary embodiments of the invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

We claim:

1. A method for optically testing an IC (integrated circuit) chip, comprising the steps of:
   mounting an IC chip to a first surface of a mounting plate of a chip packaging apparatus, wherein the mounting plate is transparent to one or more wavelengths of light to provide optical access to a back side of the IC chip;
   forming electrical connections between the IC chip and the packaging apparatus to provide electrical access to a front side of the IC chip; and
   performing optical testing of the IC chip through optical access from the back side of the IC chip,
   wherein performing optical testing of the IC chip comprises placing a photon collecting device adjacent a second surface of the mounting plate, opposite the first surface of the mounting plate, to collect photons emitted from the back side of the IC chip and passing through the mounting plate from the first surface to the second surface.

2. The method of claim 1, wherein the photons are emitted from the back side of the IC chip upon applying an electrical signal to the front side of the IC chip.

3. The method of claim 1, further comprising the step of removing heat from the mounting plate using forced air cooling or liquid cooling.

4. The method of claim 1, wherein the photon collecting device comprises an objective lens.

5. A method a for optically testing an IC (integrated circuit) chip, comprising the steps of:
   mounting an IC chip to a first surface of a mounting plate of a chip packaging apparatus, wherein the mounting plate is transparent to one or more wavelengths of light to provide optical access to a back side of the IC chip;
   forming electrical connections between the IC chip and the packaging apparatus to provide electrical access to a front side of the IC chip; and
   performing optical testing of the IC chip through optical access from the back side of the IC chip,
   wherein performing optical testing of the IC chip comprises
   placing a photon emitting device adjacent a second surface of the mounting plate, opposite the first surface of the mounting plate,
   emitting photons toward a point of interest on the back side of the IC chip through the second surface and first surface of the mounting plate, and
   identifying a defect in the IC chip corresponding to the point of interest by analyzing an electrical response of the IC chip based on electrical signals measured on one or more of the electrical connections to the front side of the IC chip.

6. The method of claim 5, further comprising the step of removing heat from the mounting plate using forced air cooling or liquid cooling.

7. A method for optically testing an IC (integrated circuit) chip, comprising the steps of:
   mounting an IC chip to a first surface of a mounting plate of a chip packaging apparatus, wherein the mounting plate is transparent to one or more wavelengths of light to provide optical access to a back side of the IC chip;
   forming electrical connections between the IC chip and the packaging apparatus to provide electrical access to a front side of the IC chip; and
   performing optical testing of the IC chip through optical access from the back side of the IC chip,
   wherein performing optical testing of the IC chip comprises placing a photon emitting device and a photon collecting device adjacent a second surface of the mounting plate, opposite the first surface of the mounting plate, emitting photons towards the back side of the IC chip through the second surface and first surface of the mounting plate, and collecting reflected photons, wherein the reflected photons are reflected by the back side of the IC chip and pass through the first surface and second surface of the mounting plate.

8. The method of claim 7, further comprising the step of removing heat from the mounting plate using forced air cooling or liquid cooling.

9. The method of claim 7, wherein the photon collecting device comprises an objective lens.

\* \* \* \* \*